(12) United States Patent
Agashe et al.

(10) Patent No.: US 12,057,336 B2
(45) Date of Patent: Aug. 6, 2024

(54) ESTIMATING HEIGHTS OF DEFECTS IN A WAFER BY SCALING A 3D MODEL USING AN ARTIFICIAL NEURAL NETWORK

(71) Applicant: SAMSUNG ELECTRONICS CO., LTD., Suwon-si (KR)

(72) Inventors: Shashank Shrikant Agashe, Bangalore (IN); Gaurav Kumar, Bangalore (IN); Sathyanarayanan Kulasekaran, Bangalore (IN); Chanwoo Park, Suwon-si (KR); Yunje Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 718 days.

(21) Appl. No.: 17/190,885

(22) Filed: Mar. 3, 2021

(65) Prior Publication Data
US 2022/0189806 A1    Jun. 16, 2022

(30) Foreign Application Priority Data

Dec. 16, 2020 (IN) .............................. 202041054786

(51) Int. Cl.
*H01L 21/67* (2006.01)
*G01N 23/2251* (2018.01)
(Continued)

(52) U.S. Cl.
CPC ... *H01L 21/67288* (2013.01); *G01N 23/2251* (2013.01); *G06T 7/001* (2013.01); *G06T 17/00* (2013.01); *G06T 19/20* (2013.01); *G01N 2223/07* (2013.01); *G01N 2223/418* (2013.01); *G01N 2223/507* (2013.01);
(Continued)

(58) Field of Classification Search
CPC .......... H01L 21/67288; G01N 23/2251; G01N 2223/07; G01N 2223/418; G01N 2223/507; G01N 2223/6116; G01N 2223/646; G01N 2223/6462; G06T 7/001; G06T 17/00; G06T 19/20; G06T 2207/10061; G06T 2207/30148; G06T 2219/2016
See application file for complete search history.

(56) References Cited

U.S. PATENT DOCUMENTS 5,544,256 A    8/1996 Brecher et al.
8,682,466 B2   3/2014 Ko et al.
(Continued)

*Primary Examiner* — Hwa Andrew Lee
(74) *Attorney, Agent, or Firm* — F. CHAU & ASSOCIATES, LLC

(57) ABSTRACT

The present disclosure relates to a method for estimating heights of defects in a wafer. The method comprises creating an un-calibrated 3D model of a defect in a wafer, determining one or more attributes associated with the un-calibrated 3D model, transforming the un-calibrated 3D model to a calibrated 3D model, and estimating a height of the defect using the calibrated 3D model. Creating an un-calibrated 3D model corresponds to a defect present in a wafer based on a plurality of Scanning Electron Microscope (SEM) images of the defect. Transforming the un-calibrated 3D model to a calibrated 3D model uses a scaling factor corresponding to the determined one or more attributes associated with the un-calibrated 3D model. A height of the defect is estimated based on the calibrated 3D model of the defect.

8 Claims, 6 Drawing Sheets

(51) Int. Cl.
  *G06T 7/00* (2017.01)
  *G06T 17/00* (2006.01)
  *G06T 19/20* (2011.01)

(52) U.S. Cl.
  CPC .............. *G01N 2223/6116* (2013.01); *G01N 2223/646* (2013.01); *G06T 2207/10061* (2013.01); *G06T 2207/30148* (2013.01); *G06T 2219/016* (2013.01)

(56) References Cited

U.S. PATENT DOCUMENTS

| | | |
|---|---|---|
| 9,324,178 B2 | 4/2016 | Cheng et al. |
| 9,378,923 B2 | 6/2016 | Schwarzband et al. |
| 2018/0149603 A1* | 5/2018 | Bhattacharyya ..... G01R 31/311 |
| 2021/0026338 A1* | 1/2021 | Yati ....................... G06T 7/0006 |
| 2022/0043357 A1* | 2/2022 | Young ..................... G06T 7/586 |

* cited by examiner

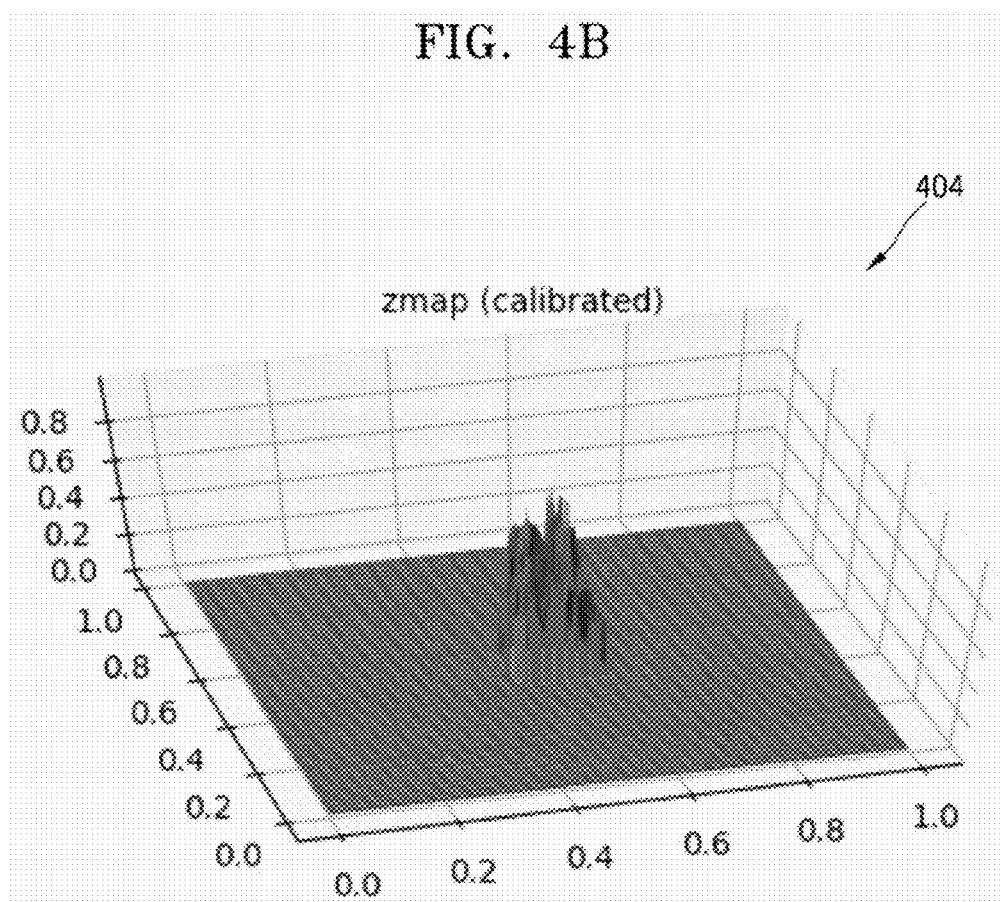

ESTIMATING HEIGHTS OF DEFECTS IN A WAFER BY SCALING A 3D MODEL USING AN ARTIFICIAL NEURAL NETWORK

CROSS-REFERENCE TO RELATED APPLICATION

This application claims priority to, and the benefit of, Indian patent Application Serial No. 202041054786 filed on Dec. 16, 2020. The entire contents of the foregoing application are hereby incorporated by reference for all purposes

FIELD OF THE INVENTION

The present disclosure, in general, relates to inspection of wafers and, in particular, relates to estimating heights of defects in a wafer.

BACKGROUND

Semiconductors are manufactured using a wafer made of a silicon-type material. During the semiconductor manufacturing process, random particle defects reduce the overall output of usable wafers. In certain instances, some defects are classified as killer defects. Killer defects occur when a height of a defect is large enough to effect the top layer of a wafer during subsequent manufacturing steps. In a vertical stacking manufacturing technique, where semiconductor layers are stacked on top of each other, identification of a killer defect during an early manufacturing step helps reduces overall manufacturing time by reducing waste and error.

Techniques for physically inspecting a wafer may include estimating heights of defects in the wafer by cross-sectioning the defect using a focused ion beam (FIB) technique. The cross-sectioning of the wafer may result in disfigurement or impairment of the wafer structure being tested for defects. As a result, the tested wafer is rendered useless and is disposed of. Additionally, physical inspection of a wafer may be a time-consuming method due to the cross sectioning and associated inspection that follows, which may delay the manufacturing process of the wafer as well. Therefore, there is a need in the art to test a wafer height without physically effecting the wafer.

SUMMARY

The summary is provided to introduce a selection of concepts, in a simplified format, that are further described in the detailed description of the present disclosure. The summary is not intended to identify key or essential inventive concepts of the present disclosure, nor is the summary intended to limit the scope of the present disclosure.

In an embodiment, a method of estimating heights of defects in a wafer is disclosed. The method comprises creating an un-calibrated three-dimensional (3D) model corresponding to a defect present in a wafer based on a plurality of Scanning Electron Microscope (SEM) images of the defect. The method further comprises determining one or more attributes associated with the un-calibrated 3D model. The method further comprises transforming the un-calibrated 3D model to a calibrated 3D model based on a scaling factor corresponding to the one or more attributes associated with the un-calibrated 3D model. The method further comprises estimating a height of the defect based on the calibrated 3D model associated with the defect.

In another embodiment, a system for estimating heights of defects in a wafer is disclosed. The system comprises a processor. The system further comprises a model creator coupled to the processor and configured to create an un-calibrated 3D model corresponding to a defect present in a wafer based on a plurality of SEM images of the defect. The model creator is further configured to determine one or more attributes associated with the un-calibrated 3D model. The model creator is further configured to transform the un-calibrated 3D model to a calibrated 3D model using a scaling factor corresponding to the determined one or more attributes associated with the un-calibrated 3D model. The system further comprises a height estimator coupled to the processor and configured to estimate a height of the defect based on the calibrated 3D model associated with the defect.

In another example embodiment, a method of correlating a plurality of scaling factors to a plurality of defects, wherein the plurality of scaling factors are to be used in estimating height of defects during testing of wafers is disclosed. The method comprises obtaining a set of SEM images corresponding to a defect present in a wafer, from a training dataset, wherein the training dataset comprises a plurality of sets of SEM images corresponding to a plurality of defects, creating an un-calibrated 3D model of the defect based on the obtained set of SEM images, transforming the un-calibrated 3D model to a calibrated 3D model using a scaling factor, creating a shadow mask associated with the defect based on the obtained set of SEM images, creating a candidate shadow mask based on the calibrated 3D model and a light variable selected from a set of light variables, wherein each variable in the set of light variables is representative of a light direction, determining a shadow loss based on the shadow mask and the candidate shadow mask, determining whether a minimum value of the shadow loss is obtained based on a set of previous values of the shadow loss, and mapping the scaling factor with one or more attributes of the un-calibrated 3D model of the defect, upon determining that the minimum value of the shadow loss is obtained.

In another example embodiment, a system for correlating a plurality of scaling factors to a plurality of defects, wherein the plurality of scaling factors are to be used in estimating height of defects during testing of wafers is disclosed. The system includes a processor and a training engine coupled to the processor. In an example, the training engine is configured to obtain a set of SEM images corresponding to a defect of the wafer from a training dataset, wherein the training dataset comprises a plurality of sets of SEM images corresponding to a plurality of defects, create an un-calibrated 3D model of the defect based on the obtained set of SEM images of the defect, transform the un-calibrated 3D model to a calibrated 3D model using a scaling factor, create a shadow mask associated with the defect based on the obtained set of SEM images, create a candidate shadow mask based on the calibrated 3D model and a light variable selected from a set of light variables, wherein each variable in the set of light variables is representative of a light direction, determine a shadow loss based on the shadow mask and the candidate shadow mask, determine whether a minimum value of the shadow loss is obtained based on a set of previous values of the shadow loss, and map the scaling factor with one or more attributes of the un-calibrated 3D model of the defect, upon determining that the minimum value of the shadow loss is obtained.

To further clarify advantages and features of the present disclosure, a more particular description of the present disclosure will be rendered by reference to specific embodiments thereof, which is illustrated in the appended drawings. It is appreciated that these drawings depict only typical embodiments of the present disclosure and are therefore not to be considered limiting of its scope. The present disclosure will be described and explained with additional specificity and detail with the accompanying drawings.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 4B illustrates an example of a calibrated 3D model.

Figure 1A:
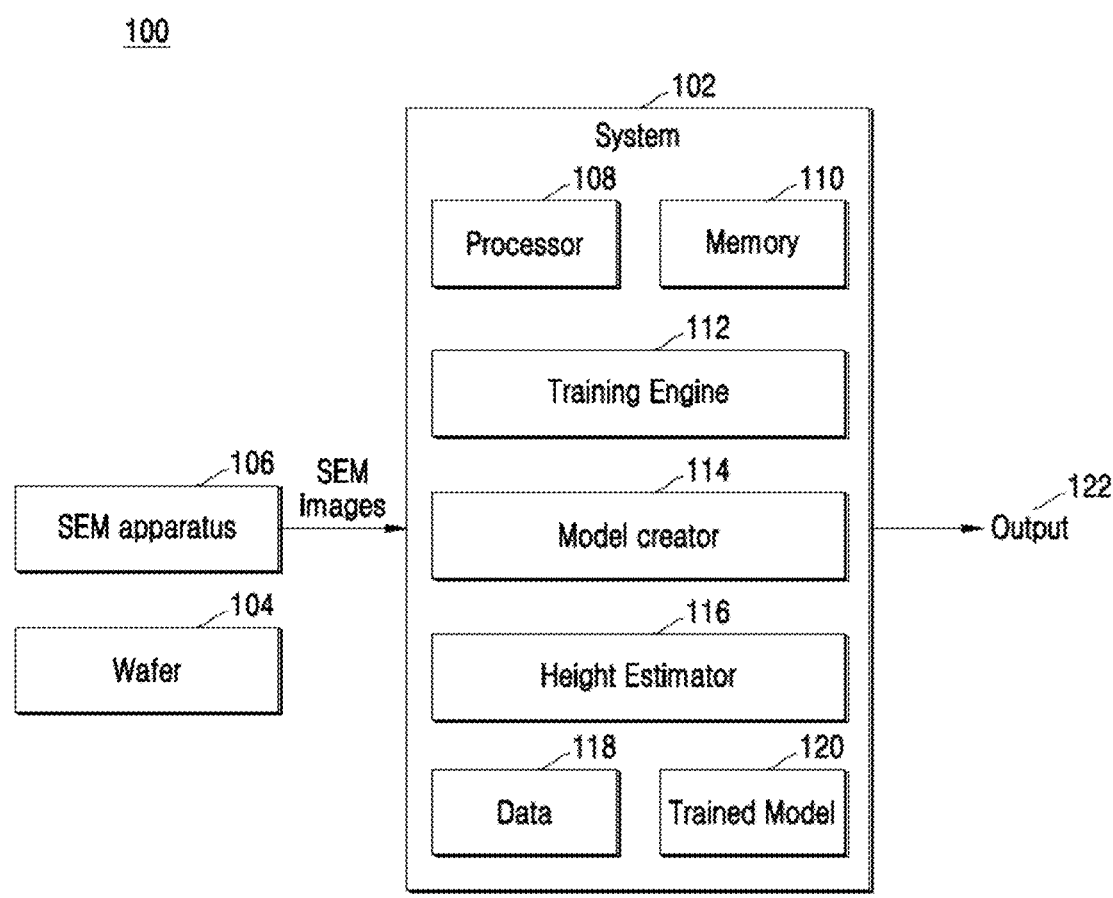
FIG. 1(a) illustrates a system for estimating heights of defects in a wafer, according to one or more embodiments of the present subject matter.

Further, skilled artisans will appreciate that elements in the drawings are illustrated for simplicity and may not have necessarily been drawn to scale. For example, the flow charts illustrate the method in terms of the most prominent steps involved to help the understanding of aspects of the present disclosure. Furthermore, in terms of the construction of the device, one or more components of the device may have been represented in the drawings by conventional symbols, and the drawings may show only those specific details pertinent to understanding the embodiments of the present disclosure so as not to obscure the drawings with details readily apparent to those of ordinary skill in the art using the description herein.

DETAILED DESCRIPTION OF FIGURES

The present disclosure relates generally to a semiconductor wafer measurement method. Specifically, embodiments of the present disclosure relate to a method of measuring heights of a wafer without physically touching the wafer. In some embodiments, various heights of a wafer may be measured using a digital three-dimensional (3D) model rather than a physical sample of the wafer. Measuring a wafer with physical techniques effects the overall usefulness of the tested wafer, as the tested wafer sample may be rendered useless and may be disposed of after testing.

The method of the present disclosure comprises creating an un-calibrated 3D model, determining one or more attributes associated with the un-calibrated 3D model, transforming the un-calibrated 3D model to a calibrated 3D model, and estimating a height of a defect using the calibrated 3D model. Creating an un-calibrated 3D model corresponds to modelling a defect present in a wafer based on a plurality of Scanning Electron Microscope (SEM) images of the defect. The un-calibrated 3D model may be transformed to a calibrated 3D model using a scaling factor corresponding to the determined one or more attributes associated with the un-calibrated 3D model. A height of the defect may be estimated based on the calibrated 3D model associated with the defect.

For the purpose of promoting an understanding of the principles of the present disclosure, reference will now be made to embodiments illustrated in the drawings, and specific language will be used to describe the same. It will nevertheless be understood that no limitation of the scope of the present disclosure is thereby intended. Alterations and further modifications in the illustrated system and further applications of the principles of the present disclosure are contemplated as would normally occur to one skilled in the art to which the present disclosure relates.

It will be understood by those skilled in the art that the foregoing general description and the following detailed description are explanatory of the present disclosure and are not intended to be restrictive thereof.

Reference throughout the present disclosure to "an aspect", "another aspect" or similar language means that a particular feature, structure, or characteristic described in connection with the embodiment is included in at least one embodiment of the present disclosure. Thus, appearances of the phrase "in an embodiment", "in another embodiment" and similar language throughout the present disclosure may, but do not necessarily, all refer to the same embodiment.

The terms "comprises", "comprising", or any other variations thereof, are intended to cover a non-exclusive inclusion, such that a process or method that comprises a list of steps included in the present disclosure and other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skilled in the art to which the present disclosure belongs. The system, methods, and examples provided herein are illustrative only and are not intended to be limiting.

Embodiments of the present disclosure will be described below in detail with reference to the accompanying drawings.

FIG. 1(a) illustrates an environment 100 implementing a system 102 for estimating heights of defects in a wafer 104, according to one or more embodiments of the present disclosure. The terms "wafer" and "wafer structure" may be used interchangeably herein, and the same has been illustrated as wafer 104 in the drawings. Examples of the devices in which the system 102 may be implemented include, but are not limited to, a laptop, a desktop computer, a smartphone, a tablet, a distributed computing system, a server, and a cloud server. In an example, the system 102 may be implemented by a manufacturing enterprise or a production facility involved in the manufacturing of wafer structures, such as the wafer 104, for testing or inspection of wafer structures. In an example, the testing or inspection of the wafer 104 may be performed after any stage in the manufacturing or production of the wafer 104.

For testing of the wafer 104, in an example, the environment 100 includes a scanning electron microscope (SEM) apparatus 106. The SEM apparatus 106 may be configured to capture and provide SEM images corresponding to defects present in the wafer 104 to the system 102. In an example, the system 102 may be configured to estimate the height of defects present in the wafer 104 by analyzing the SEM images and provide the same as output 122. For example, the techniques described herein may be implemented to estimate the height of a defect that may occur during a manufacturing process. During a manufacturing process, layers may be deposited on substrate in various stages. Testing or inspection of the wafer 104 may be performed after any stage in the manufacturing or production of the wafer 104 in order to access the wafer 104 of any manufacturing defects. Specifically, a wafer 104 may be inspected for defects where any portion of a layer is less than or greater than a desired layer thickness. As described herein, the difference between an intended layer thickness and an actual layer thickness may be referred to as the height of a defect. The described techniques may provide for more accurate, and less invasive, measurement of the height of any defects, which may improve manufacturing and production of wafers.

In an example embodiment, the system 102 may include a processor 108, memory 110, a training engine 112, a model creator 114, a height estimator 116, data 118, and a trained model 120. In an example, the memory 110, the training engine 112, the model creator 114, the height estimator 116, and the trained model 120 are coupled to the processor 108.

In an example, the processor 108 may be a single processing unit or a number of units with multiple computing units. The processor 108 may be implemented as one or more microprocessors, microcomputers, microcontrollers, digital signal processors, central processing units, state machines, logic circuitries, and/or any devices that manipulate signals based on operational instructions. Among other capabilities, the processor 108 is configured to fetch and execute computer-readable instructions and data stored in the memory 110.

The memory 110 may include any non-transitory computer-readable medium known in the art including, for example, volatile memory, such as static random access memory (SRAM) and dynamic random access memory (DRAM), and/or non-volatile memory, such as read-only memory (ROM), erasable programmable ROM, flash memories, hard disks, optical disks, and magnetic tapes.

The training engine 112, the model creator 114, and the height estimator 116, amongst other things, include routines, programs, objects, components, data structures, etc., which perform particular tasks or implement data types. The training engine 112, the model creator 114, and the height estimator 116 may also be implemented as signal processor(s), state machine(s), logic circuitries, and/or any other device or component that manipulate signals based on operational instructions. Furthermore, training engine 112, the model creator 114, and the height estimator 116 may be implemented in hardware, instructions executed by a processing unit, or by a combination thereof. The processing unit can comprise a computer, a processor, such as the processor 108, a state machine, a logic array, or any other suitable devices capable of processing instructions. The processing unit can be a general-purpose processor that executes instructions to cause the general-purpose processor to perform tasks or the processing unit can be dedicated to performing functions. In another aspect of the present subject matter, the training engine 112, the model creator 114, and the height estimator 116 may be machine-readable instructions (software), which, when executed by a processor/processing unit, performs any of the described functionalities.

The data 118 serves, amongst other things, as a repository for storing data processed, received, and generated by one or more of the processor 108, the training engine 112, the model creator 114, and the height estimator 116. In some cases, data 118 may refer to a database. Data 118 may be an organized collection of data. For example, data 118 may store data in a specified format known as a schema. Data 118 may be structured as a single database, a distributed database, multiple distributed databases, or an emergency backup database. In some cases, a database controller may manage data storage and processing of data 118. In some cases, a user interacts with database controller. In other cases, database controller may operate automatically without user interaction.

Further, in a non-limiting manner, one or more of the aforementioned components of the system 102 may send or receive data, for example, using one or more input/output ports and one or more communication units.

In an example, the trained model 120 may be understood as a model developed using machine learning or artificial intelligence-based techniques, such as using an artificial neural network (ANN). Thus, determining scaling factors to be used in estimating heights of defect of a wafer may be performed using an ANN. In said example, the scaling factor may be represented by a deep neural network layer.

An ANN is a hardware or a software component that includes a number of connected nodes (i.e., artificial neurons), which loosely correspond to the neurons in a human brain. Each connection, or edge, transmits a signal from one node to another (like the physical synapses in a brain). When a node receives a signal, it processes the signal and then transmit the processed signal to other connected nodes. In some cases, the signals between nodes comprise real numbers, and the output of each node is computed by a function of the sum of its inputs. Each node and edge is associated with one or more node weights that determine how the signal is processed and transmitted.

During the training process, these weights are adjusted to improve the accuracy of the result (i.e., by minimizing a loss function which corresponds in some way to the difference between the current result and the target result). The weight of an edge increases or decreases the strength of the signal transmitted between nodes. In some cases, nodes have a threshold below which a signal is not transmitted at all. In some examples, the nodes are aggregated into layers. Different layers perform different transformations on their inputs. The initial layer is known as the input layer and the last layer is known as the output layer. In some cases, signals traverse certain layers multiple times.

In an example, the artificial intelligence-based model may be obtained by training. Here, "obtained by training" may refer to a predefined operation rule or artificial intelligence-based model configured to perform a feature (or function) obtained by training a basic artificial intelligence model with multiple pieces of training data using a training technique. In an example, the artificial intelligence-based model may include a plurality of neural network layers. Each of the plurality of neural network layers may include a plurality of weight values and may perform neural network computation by computation between a result of computation by a previous layer and the plurality of weight values.

In another example, the trained model 120 may be any computational model that may be trained for determining optimum scaling factors that may be used to estimate heights of defects present in wafers, such as the wafer 104. In an example, the computational model may be a scaling function. In an example, the trained model 120 may be specific to a given SEM equipment, such as the SEM apparatus 106. For example, for a different SEM equipment, another training model may be developed.

In some cases, the trained model 120 may include a convolutional neural network (CNN). A CNN is a class of neural network that is commonly used in computer vision or image classification systems. In some cases, a CNN may enable processing of digital images with minimal pre-processing. A CNN may be characterized by the use of convolutional (or cross-correlational) hidden layers. These layers apply a convolution operation to the input before signaling the result to the next layer. Each convolutional node may process data for a limited field of input (i.e., the receptive field). During a forward pass of the CNN, filters at each layer may be convolved across the input volume, computing the dot product between the filter and the input. During the training process, the filters may be modified so that they activate when they detect a particular feature within the input.

According to aspects of the present subject matter, the system 102 may be configured to estimate heights of defects present in the wafer 104. In an example embodiment, the system 102 may be configured to receive a plurality of SEM images associated with a defect of a wafer. In an example, the plurality of SEM images may be received, for instance, from the SEM apparatus 106. In an example embodiment, the SEM images may be provided to the system 102, using other means, such as a portable storage device. On receiving the SEM images, the system 102 processes the SEM images to estimate the height of the defect.

More particularly, in an example embodiment, the system 102 may be configured to create an un-calibrated 3D model corresponding to the defect based on the plurality of SEM images. In an example, the 3D model may be a height map, such as a Z-map of the defect. Generally, a 3D reconstruction of a defect will not be at-scale with real-world coordinates of the defect due to unknown light direction. As a result, a given 2D image can be mapped to many possible 3D reconstructions. The 3D reconstructions may have different tuple data sets with a scaling factor and a light direction. Additionally or alternatively, there may be many (e.g., infinite) possible values of the scaling factor and the light direction for which the 3D reconstruction will generate the same 2D structure. Additionally or alternatively, for each light direction, there may be a corresponding scale which may follow a constraint (e.g., a constraint that may be referred to as a General Bas-relief (GBR) ambiguity). As a result, an un-calibrated 3D model may be understood as each defect may be at a different scale level and light direction. Therefore, defect dimensions may not be comparable among each other as well as with global reference dimensions (i.e., real-world dimension).

After creating the un-calibrated 3D model, in an example, the system 102 may be configured to determine one or more attributes associated with the un-calibrated 3D model. In an example, the one or more attributes may include, but are not limited to, a width of the 3D model and a length of the 3D model. These attributes may be used by the system 102 to transform the un-calibrated 3D model of the defect to a calibrated 3D model of the defect. A calibrated 3D model may be a reconstructed 3D model of the defect aligned to a fixed scale and light direction so the reconstructed 3D model models the defect in global reference dimensions.

In an example, the system 102 may be configured to transform the un-calibrated 3D model to a calibrated 3D model using a scaling factor corresponding to the determined attributes of the un-calibrated 3D model. In an example, the scaling factor may be a single multiplier. In another example, the scaling factor may be a kernel. In yet another example, the scaling factor may be a CNN layer.

The transformation of the un-calibrated 3D model to the calibrated 3D model may be understood as modifying a scale of the un-calibrated 3D model using the scaling factor. The modification of the scale is intended to achieve a 3D model with a scale to represent the defect (e.g., with a scale to represent the defect with global reference dimensions, such as real-world dimensions). The scale corrected 3D model representing the defect as mentioned above may be referred to as the calibrated 3D model. In an example embodiment, the system 102 may select the scaling factor based on one or more attributes associated with the un-calibrated 3D model. Examples of the one or more attributes may include, but are not limited to, "M and N", where the M is a width of the 3D model and N is a length of the 3D model.

In an example, the scaling factor may be used to transform a width and a length of the un-calibrated 3D model to a calibrated width and a calibrated length of a calibrated 3D model. In other words, the scaling factor may be used to transform a scale of the un-calibrated 3D model to a calibrated scale of a calibrated 3D model. In some examples, transforming an un-calibrated 3D model to a calibrated 3D model may include multiplying one or more of a width, a length, and a scale of the un-calibrated 3D model by a multiplier or a kernel. In some examples, transforming an un-calibrated 3D model to a calibrated 3D model may include transforming one or more of a width, a length, and a scale of the un-calibrated 3D model via a CNN layer.

As described herein, the system 102 may be configured to select the scaling factor based on the one or more attributes. For selecting the scaling factor, in an example embodiment, the system 102 may be configured to provide the one or more attributes as an input to the trained model 120. Based on the training, the trained model 120 may then determine the scaling factor based on the values of the one or more attributes. Accordingly, the determined scaling factor is then provided as an output. The scaling factor may then be used for transforming the un-calibrated 3D model to a calibrated 3D model. In an example, the 3D model is a height map or a z-map. Thus, the un-calibrated z-map is transformed to a calibrated z-map.

As described herein, the scaling factor may be determined or selected based on the one or more attributes associated with the un-calibrated 3D model. For instance, usage of a scaling multiplier, a kernel, or a CNN layer as a scaling factor may be based on a width of the un-calibrated 3D model, a length of the un-calibrated 3D model, a scale of the un-calibrated 3D model, or a combination thereof. In some examples, scaling multiplier values, kernel values, CNN layer attributes, etc. may be determined based on the one or more attributes associated with the un-calibrated 3D model (e.g., based on a width of the un-calibrated 3D model, a length of the un-calibrated 3D model, a scale of the un-calibrated 3D model, or a combination thereof).

Upon transforming the un-calibrated 3D model to the calibrated 3D model, the system 102 may be configured to estimate a height (e.g., a height in real-world dimensions) of the defect based on the calibrated 3D model.

Figure 1B:
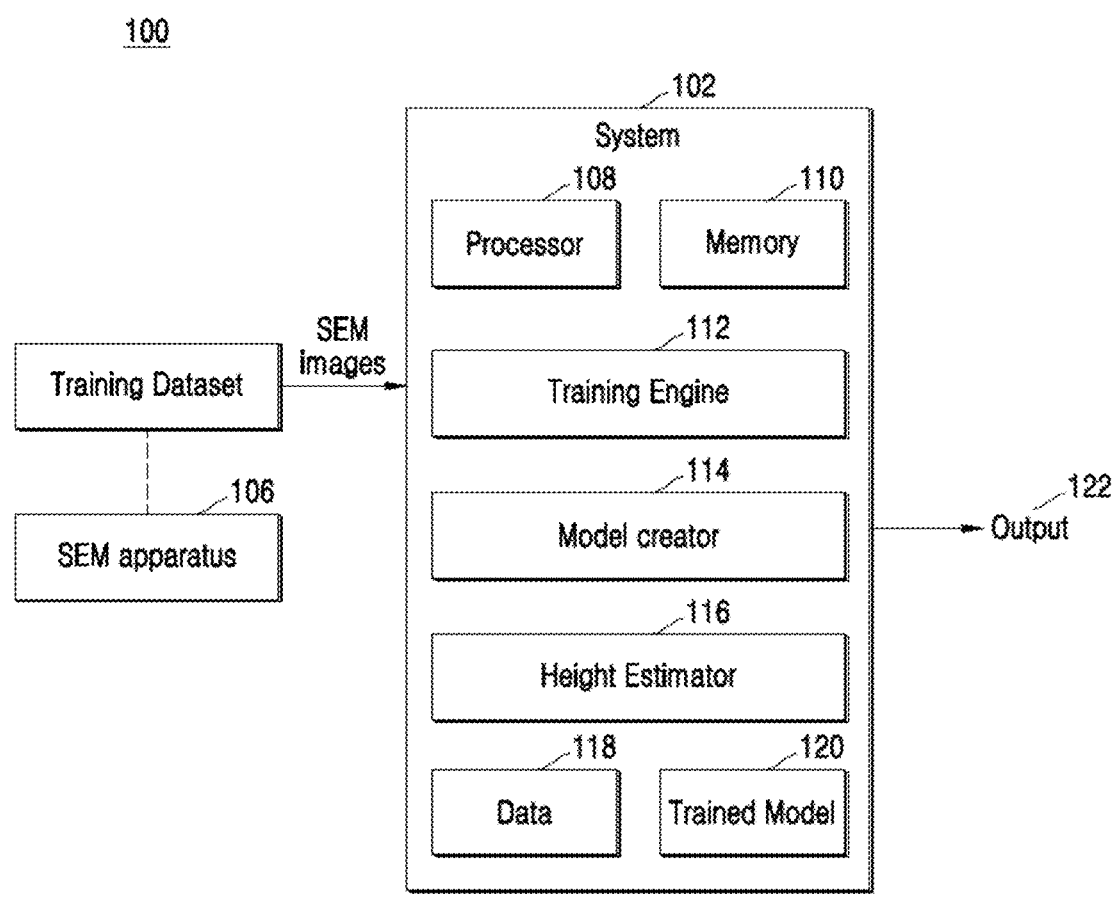
FIG. 1(b) illustrates a system for training a model for determining scaling factors to be used for estimating heights of defects in a wafer, according to one or more embodiments of the present subject matter.

Referring to FIG. 1(b), in an example embodiment, prior to deployment of the system 102, a training of the system 102 may be performed. In training, the system 102 may be configured to correlate a plurality of scaling factors with a plurality of defects. More particularly, the correlation may include mapping the scaling factors with the attributes of the un-calibrated 3D models corresponding to the defects. For instance, scaling multiplier values, kernel values, CNN layer attributes, etc. may be correlated or mapped to different attribute values (e.g., scales, heights, widths) of un-calibrated 3D models. Accordingly, based on the values of one or more attributes of an un-calibrated 3D models, a correlated scaling factor may be determined based on the mapping. In an example, correlation and/or mapping may be performed by a model. Accordingly, at the end of the training, the system 102 develops a trained model 120 that may be configured to determine the scaling factor for a given set of attributes corresponding to an un-calibrated 3D mode that may be provided as input thereto.

A training dataset, hereinafter referred to as SEM dataset, may be provided to the system 102 for training during the training phase. The SEM dataset comprises a plurality of sets of SEM images corresponding to a plurality of defects. The system 102, in an example embodiment, may be configured to utilize a percentage of the SEM dataset for training and may utilize the remainder of the SEM dataset for testing. For example, the system 102 may be configured to utilize eighty percent of the SEM dataset for training and twenty percent of the SEM dataset for testing.

In an example embodiment, during the training, the training engine 112 may be configured to select a defect and may obtain the plurality of SEM images corresponding to the defect from the SEM dataset. After obtaining the SEM images, the training engine 112 may be configured to create an un-calibrated 3D model associated with the defect based on the SEM images of the defect. As an example, and not as a limitation, the 3D model may be a Z-map with attributes such as a width M and a length N.

When the un-calibrated Z-map is created, the model creator 114 may then select a scaling factor. In an example, during a first run of the training phase for a given defect, the scaling factor may be selected arbitrarily. When the scaling factor is selected, the training engine 112 may be configured to transform the un-calibrated Z-map to a calibrated Z-map based on the scaling factor. In an example, for the transformation, the training engine 112 may adjust a scale of the un-calibrated Z-map based on the scaling factor. Additionally or alternatively, in an example, each pixel of the Z-map may be transformed based on the scaling factor. Accordingly, the calibrated Z-map may be obtained. In an example, the un-calibrated Z-map and the calibrated Z-map may be stored in the data 118.

In an example embodiment, during the training phase, the training engine 112 may be configured to create a shadow mask, for example, a shadow binary mask, associated with the defect based on the plurality of SEM images of the defect. As an example, and not as a limitation, the present description has been explained using a shadow binary mask. In an example, the training engine 112 may be configured to create the shadow binary mask based on the plurality of SEM images of the defect and at least one image processing technique.

Further, in an example embodiment, the training engine 112 may be configured to obtain the calibrated Z-map from the data 118. Thereafter, the training engine 112 may be configured to create a candidate shadow binary mask based on the calibrated 3D model, i.e., Z-map, and a light variable selected from a set of light variables. Herein, each variable in the set of light variables is representative of a light direction. In an example, during a first run of the training phase for a given defect, the light variable may be selected arbitrarily or may be selected based on a predefined technique. Based on the selected light variable and the calibrated Z-map, the candidate shadow binary mask is created.

In an example embodiment, as a next step in the training phase, the training engine 112 may be configured to determine a shadow loss or a non-differentiable loss function based on the shadow binary mask and the candidate shadow binary mask. Thereafter, the training engine 112 may determine if a minimum value of the shadow loss has been obtained. In an example, the training engine 112 may use previously computed values of the shadow loss to determine whether the minimum value has been obtained. These values may be stored as a set of previous values of shadow loss in the data 118. Based on an outcome of the determination, the training engine 112 may be configured to map the scaling factor with one or more attributes of the un-calibrated 3D model, as is described below.

In an example, if the minimum value of the shadow loss has not been obtained, the training engine 112 may perform the training process an iterative manner until the lowest value of the shadow loss is obtained. In each of the iterations, the training engine 112 may be configured to adjust or update a value of at least one of the scaling factor and the light variable. In an example, the adjusting of the scaling factor and the light variable may be done based on the shadow loss, i.e., as a function of the shadow loss. For example, a gradient of the shadow loss may be added to a scaling factor to obtain the new scaling factor. In an example, if the value of the scaling factor is updated, the training engine 112 may be configured to calibrate the 3D model and thereafter repeat the aforementioned steps of training with the light direction not changed. In an example, if the value of the light direction is changed, the training engine 112 may be configured to recreate the candidate shadow binary mask and thereafter, repeat the steps of training. In an example, if the value of both the scaling factor and the light variable is updated, the training engine 112 may be configured to again calibrate the 3D model and thereafter repeat the aforementioned steps of training including a recreation of the candidate shadow binary mask based on the updated light variable.

In another example, the training engine 112 may be configured to identify the one or more attributes associated with the un-calibrated 3D model when the training engine 112 determines that the minimum value of the shadow loss has been obtained. Furthermore, the training engine 112 may be configured to store the scaling factor in a mapped relationship with the one or more attributes of the un-calibrated 3D model in the data 118. The mapping may be used for a future deployment phase. Thereafter, the training engine 112 may select another defect from the SEM dataset and may repeat the training steps as explained above. Thus, by performing these training steps, the trained model 120 is trained to determine scaling factors for un-calibrated 3D models.

As explained above, the trained model 120 may be used during the deployment phase by the system 102 to estimate the height of defects in wafers.

In an example embodiment, during the deployment phase of the system 102, the model creator 114 may be configured to create an un-calibrated 3D model associated with a defect based on a plurality of SEM images of the defect. In an example, the SEM images may be received from the SEM apparatus 106 during an inspection of the wafer 104. The SEM images, in an example, may be taken by the SEM apparatus 106 during any stage of the wafer manufacturing process. In an example, the images may be taken as per the instructions of a user who may be an operator of the SEM apparatus 106. Furthermore, according to aspects of the present subject matter, tilting of the wafer 104 during capturing of the SEM images is not required. Furthermore, the focus of the SEM apparatus 106 is also not varied. Furthermore, in an example, the plurality of SEM images may include four to five images taken from different directions.

After receiving the SEM images, the model creator 114 may be configured to transform the un-calibrated 3D model to a calibrated 3D model using a scaling factor, where the scaling factor is determined based on one or more attributes associated with the un-calibrated 3D model. As a result, the model creator 114 may be configured to determine and provide the one or more attributes, for example, a length and width, as an input to the trained model 120. The trained model 120 then identifies the value of each of the attributes of the un-calibrated 3D model. Accordingly, the trained model 120 may be configured to determine the scaling factor corresponding to the identified values of the one or more attributes, for example, using the mapping stored in the data 118. Subsequently, the trained model 120 provides the determined scaling factor as output. The scaling factor may then be used for the transformation.

In an example, the model creator 114 may be configured to modify a scale of the un-calibrated 3D model based on the scaling factor to obtain the calibrated 3D model. Consider an example un-calibrated Z map (Zuc). The Zuc may be a matrix of shape M, N, where Z denotes the height of each pixel of the Zuc. In an example, the scaling factor may be a function F. In an example, the F may be linear or non-linear. Subsequently, equation 1 is performed to obtain a calibrated Z map (Zc).

$$Zc = F(Zuc) \quad (1)$$

As described earlier, the F is determined by the trained model 120. In an example, the F may be a linear matrix with dimensions M×N. The linear matrix may be represented by W. Accordingly, the above operation is as follows:

$$Zc = W \text{ (dot product) } Zuc \quad (2)$$

When the calibrated 3D model is obtained from the transformation using the scaling factor, in an example, the model creator 114 may store the calibrated 3D model in the data 118.

When the calibrated 3D model, i.e., the Z-map, is obtained, in an example embodiment, the height estimator 116 may be configured to estimate the height of the defect based on the calibrated 3D model. In said example embodiment, the height estimator 116 estimates the height of the defect based on a maximum z-value of the calibrated 3D model. The z-value of a 3D model may represent a height of a pixel of the 3D model. Thus, the height estimator 116 may be configured to determine the maximum height of the 3D model or the Z-map. Additionally or alternatively, the height estimator 116 estimates the maximum z-value of the calibrated Z-map. The maximum z-value is then taken as the estimated height of the defect. The estimated height is provided as the output 122 and may be displayed on a display screen by the system 102.

In an example embodiment, the system 102 may be configured to validate the calibrated 3D model. As a result, in an example embodiment, the model creator 114 may be further configured to generate a normal map based on the plurality of SEM images. The normal map, in an example, comprises first shape information of the defect. In an example, the first shape information may include information about a shape of the defect. Thereafter, the model creator 114 may be configured to generate a candidate normal map based on the calibrated 3D model. Herein, the candidate normal map comprises second shape information about the shape of the defect. Subsequently, the model creator 114 compares the first shape information and the second shape information and validates the calibrated 3D model based on the comparison. For instance, if the difference in the comparison is within an acceptable threshold limit, the model creator 114 validates the calibrated 3D model. On the other hand, if the difference in the comparison is outside an acceptable threshold limit, the model creator 114 may discard the calibrated 3D model.

As may be gathered from above, aspects of the present subject matter provide for several advantages over existing techniques of estimating heights of defects. For example, in accordance with SEM equipment parameters, electron energy, working distance, make/model, etc., are not required for estimation of height. Furthermore, a non-destructive approach is presented wherein the sample of the wafer that may be used for testing is not destroyed. Furthermore, the present disclosure is not limited to perform a calibration based on a material and/or surface type of the wafer.

Figure 2:
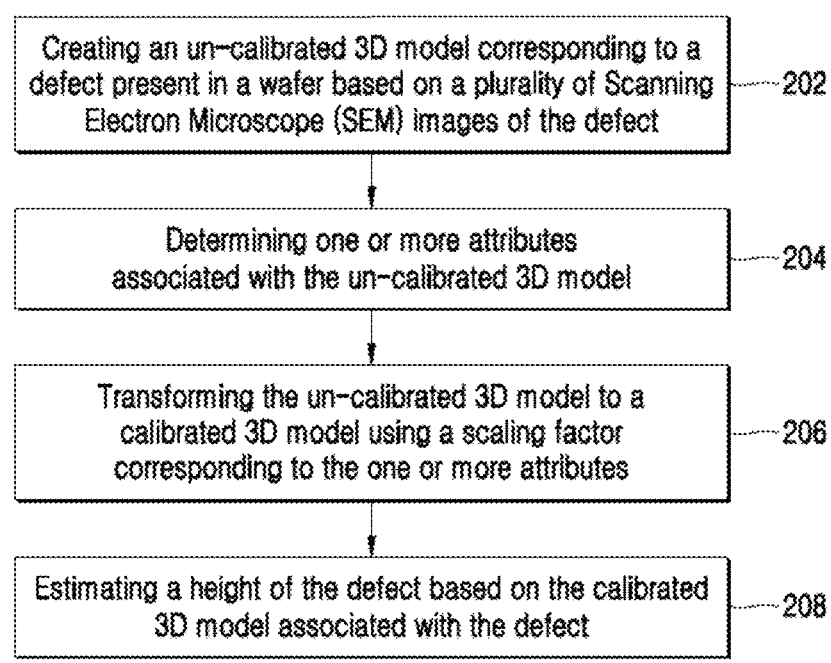
FIG. 2 illustrates a method of estimating heights of defects in a wafer, according to an embodiment of the present subject matter.

FIG. 2 illustrates a method 200 estimating heights of defects in a wafer, according to an embodiment of the present subject matter. The method 200 may be implemented using one or more components of the system 102. For the sake of brevity, details of the present disclosure explained in detail with reference to description of FIG. 1 above are not explained in detail herein.

At step 202, an un-calibrated 3D model corresponding to a defect present in a wafer is created based on a plurality of Scanning Electron Microscope (SEM) images of the defect. In an example, the un-calibrated 3D model may be created based on the SEM images and a predetermined technique. For example, a predetermined technique may be a SEM photometric stereo technique. In an example, the model creator 114 may create the un-calibrated 3D model based on the SEM images captured by the SEM apparatus 106.

Figure 4A:
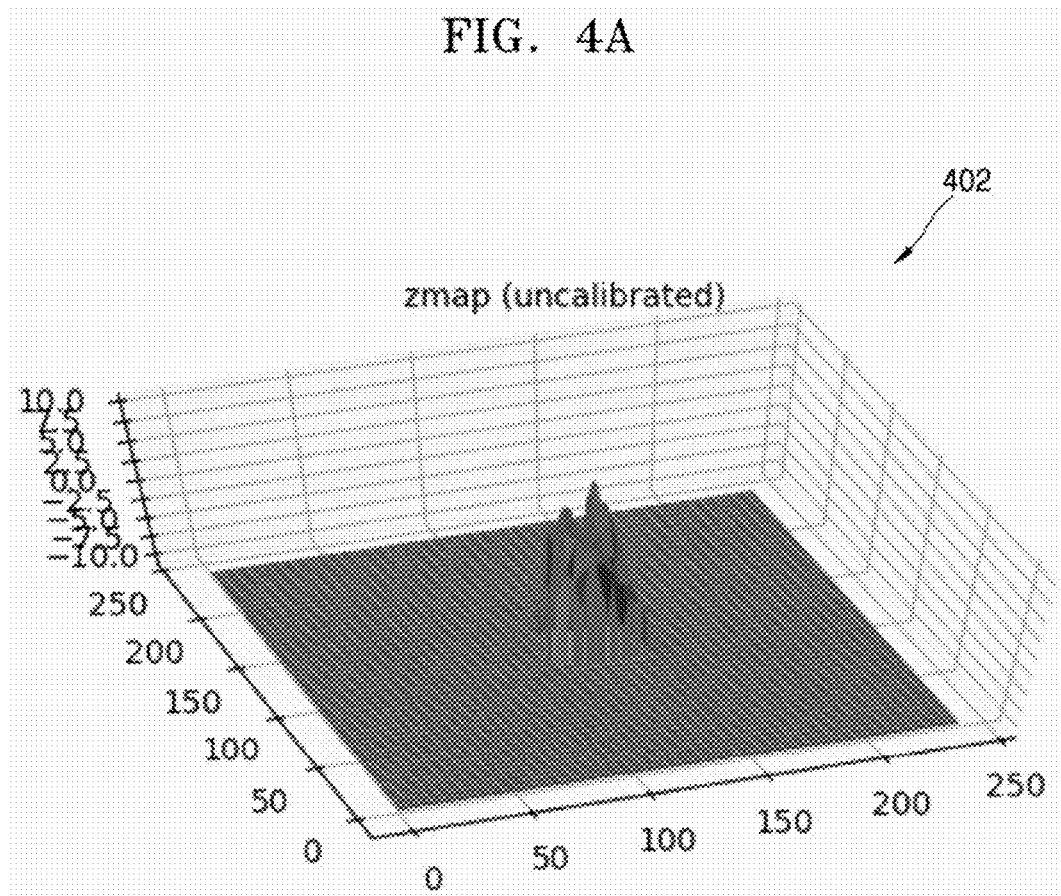
FIG. 4A illustrates an example of an un-calibrated 3D model.

At step 204, the method 200 includes determining one or more attributes associated with the un-calibrated 3D model. In an example, the one or more attributes may include a length and a width of the 3D model. In an example, the model creator 114 may be configured to determine the one or more attributes associated with the un-calibrated 3D model. An example un-calibrated 3D model 402 is shown in FIG. 4A. As shown, the un-calibrated 3D model 402 is a Z-map.

At step 206, the un-calibrated 3D model is transformed to a calibrated 3D model using a scaling factor corresponding to the determined one or more attributes. In an example, the transformation involves providing the determined one or more attributes as an input to a trained model. The trained model subsequently identifies a value of each of the one or more attributes. Thereafter, the trained model determines the scaling factor corresponding to the value of the one or more attributes associated with the un-calibrated 3D model, using a mapping, such as the mapping stored in data 118. The determined scaling factor is then provided as an output by the trained model. When the scaling factor is determined, a scale of the un-calibrated 3D model is modified based on the scaling factor to obtain the calibrated 3D model. In an example, the model creator 114 may be configured to transform the un-calibrated 3D model to a calibrated 3D model.

In an example, the method 200 further includes validating the created calibrated 3D model. As a result, in an example embodiment, the method 200 includes generating a normal map based on the plurality of SEM images. The normal map comprises first shape information about a shape of the defect. The method 200 further includes generating a candidate normal map based on the calibrated 3D model. The candidate normal map comprises second shape information about the shape of the defect. Furthermore, the method 200 includes comparing the first shape information and the second shape information and validating the calibrated 3D model based on the comparison. An example calibrated 3D model 404 is shown in FIG. 4B. As shown, the calibrated 3D model 404 is a Z-map. Furthermore, the calibrated 3D model 404 is a calibrated form of the un-calibrated 3D model 402.

At step 208, a height of the defect is estimated based on the calibrated 3D model associated with the defect. In an example, the height of the defect may be estimated based on a maximum z-value of the calibrated 3D model. In an example, the height estimator 116 may estimate the height of the defect based on the calibrated 3D model.

Figure 3:
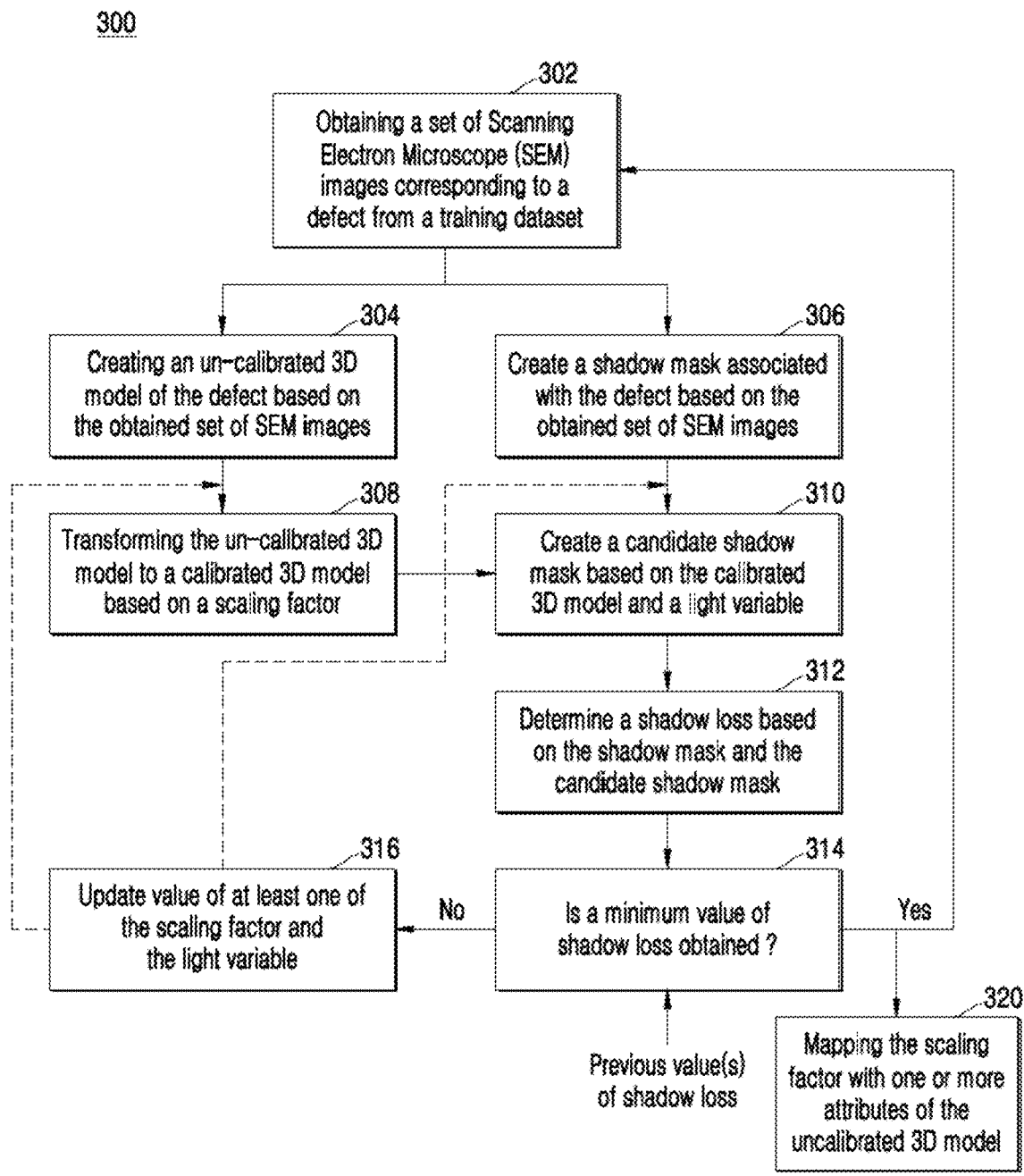
FIG. 3 illustrates a method of training of a system for estimating heights of defects in a wafer, according to an embodiment of the present subject matter.

FIG. 3 illustrates a method 300 of training of a system for estimating heights of defects in a wafer, according to an embodiment of the present subject matter. The method 300 may be implemented using one or more components of the system 102. For the sake of brevity, details of the present disclosure that may be explained in detail with reference to description of FIGS. 1 and 2 are not explained in detail herein.

The method 300 starts at step 302, where a set of Scanning Electron Microscope (SEM) images corresponding to a defect are obtained from a training dataset. In an example, the system 102 may obtain the set of SEM images from a training dataset with a plurality of sets of SEM images corresponding to a plurality of defects, as captured by a SEM apparatus, such as the SEM apparatus 106.

At step 304, an un-calibrated 3D model of the defect is created based on the obtained set of SEM images. In an example, the un-calibrated 3D model may be created based on the SEM images and a predetermined technique. In an example, the model creator 114 may create the un-calibrated 3D model based on the SEM images captured by the SEM apparatus 106.

At step 306, a shadow mask associated with the defect is created based on the obtained set of SEM images. In an example, the shadow mask may be a shadow binary mask. For the purpose of explanation, the following description is explained in reference to a shadow binary mask. In an example, the shadow binary mask may be created using a predetermined image processing technique, for example, a watershed technique. In an example, step 306 may be performed either in parallel or prior to or after step 304. In an example, the training engine 112 may be configured to create the shadow binary mask.

At step 308, the un-calibrated 3D model is transformed to a calibrated 3D model based on a scaling factor. In an example, during an initial run of the training, the scaling factor may be selected randomly. Based on the scaling factor, the un-calibrated 3D model is transformed to a calibrated 3D model.

At step 310, a candidate shadow mask is created based on the calibrated 3D model and a light variable. In an example, the light variable may represent a light direction. In an example, the training engine 112 may create the candidate shadow binary mask based on the calibrated 3D model and a light variable.

At step 312, a shadow loss based on the shadow mask and the candidate shadow mask is determined. In an example, the training engine 112 may be configured to determine the shadow loss. At step 314, an obtained minimum value of shadow loss may be determined. In an example, the previous values of the shadow loss may be used as input for determining the minimum value of shadow loss. For example, the shadow loss value may be compared to other shadow loss values. Accordingly, if the minimum value of the shadow loss is obtained, the model may correlate the scaling factor and the light direction with the input un-calibrated 3D model. Thereafter, the method proceeds to the selection of a new defect from the training dataset and performing the steps of training again. Furthermore, the method may further proceed to step 320, where the scaling factor may be mapped with one or more attributes of the un-calibrated 3D model of the defect. For example, the mapping is based on an outcome of the determining. Furthermore, prior to the mapping, the method includes determining the one or more attributes associated with the un-calibrated 3D model. Furthermore, the method includes storing the mapping in a data storage, such as the data 118.

In an example embodiment, if the shadow loss is not at a minimum value, the method proceeds to step 318, where a value of at least one of the scaling factor and the light variable is updated. In an example, the value is updated based on a gradient of the shadow loss. Subsequently, the training steps are performed again until a lowest or minimum value of the shadow loss is obtained. In an example, the training engine 112 may perform these steps as explained above in reference to FIGS. 1(a) and 1(b).

While specific language has been used to describe the present disclosure, any limitations arising on account thereto, are not intended. As would be apparent to a person in the art, various working modifications may be made to the method to implement the inventive concept as taught herein. The drawings and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment.

What is claimed is:

1. A method comprising:
providing a plurality of Scanning Electron Microscope (SEM) images of a defect in a wafer;
determining an un-calibrated 3D model corresponding to the defect, based on the plurality of SEM images of the defect;
determining one or more size attributes associated with the un-calibrated 3D model;
transforming the un-calibrated 3D model to a calibrated 3D model using a scaling factor corresponding to the determined one or more size attributes associated with the un-calibrated 3D model;
estimating a height of the defect based on the calibrated 3D model associated with the defect; and
performing a manufacturing process on the wafer based on the estimated height of the defect.

2. The method as claimed in claim 1, wherein the transforming further comprises:
providing the determined one or more size attributes as an input to a trained model;
determining, by the trained model, the scaling factor based on the one or more size attributes; and
modifying a scale of the un-calibrated 3D model based on the determined scaling factor, wherein the calibrated 3D model is obtained based on the modified scale of the un-calibrated 3D model.

3. The method as claimed in claim 1, further comprising:
generating a normal map based on the plurality of SEM images, wherein the normal map comprises first shape information of the defect;
generating a candidate normal map based on the calibrated 3D model, wherein the candidate normal map comprises second shape information of the defect;
comparing the first shape information and the second shape information; and
validating the calibrated 3D model based on the comparison.

4. The method as claimed in claim 1, wherein estimating the height of the defect further comprises:
determining a maximum z-value of the calibrated 3D model; and
selecting the maximum z-value of the calibrated 3D model as the height of the defect.

5. A method comprising:
providing a plurality of Scanning Electron Microscope (SEM) images of a defect in a wafer;
determining an un-calibrated 3D model corresponding to the defect, based on the plurality of SEM images of the defect;
determining one or more size attributes associated with the un-calibrated 3D model;
performing a convolution operation based on the one or more size attributes of the uncalibrated 3D model using a convolutional neural network to obtain a scaling factor;
transforming the un-calibrated 3D model to a calibrated 3D model using the scaling factor corresponding to the determined one or more size attributes associated with the un-calibrated 3D model;
estimating a height of the defect based on the calibrated 3D model associated with the defect: and
performing a manufacturing process on the wafer based on the estimated height of the defect.

6. The method as claimed in claim 5, wherein the transforming further comprises:
providing the determined one or more size attributes as an input to a trained model;
determining, by the trained model, the scaling factor based on the one or more size attributes; and
modifying a scale of the un-calibrated 3D model based on the determined scaling factor, wherein the calibrated 3D model is obtained based on the modified scale of the un-calibrated 3D model.

7. The method as claimed in claim 5, further comprising:
generating a normal map based on the plurality of SEM images, wherein the normal map comprises first shape information of the defect;
generating a candidate normal map based on the calibrated 3D model, wherein the candidate normal map comprises second shape information of the defect;
comparing the first shape information and the second shape information; and
validating the calibrated 3D model based on the comparison.

8. The method as claimed in claim 5, wherein estimating the height of the defect further comprises:
determining a maximum z-value of the calibrated 3D model; and
selecting the maximum z-value of the calibrated 3D model as the height of the defect.

* * * * *